US012571866B2

(12) United States Patent
Biber

(10) Patent No.: US 12,571,866 B2
(45) Date of Patent: Mar. 10, 2026

(54) SHIM TRAY FOR A GRADIENT COIL UNIT

(71) Applicant: Siemens Healthineers AG, Forchheim (DE)

(72) Inventor: Stephan Biber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 169 days.

(21) Appl. No.: 18/523,407

(22) Filed: Nov. 29, 2023

(65) Prior Publication Data

US 2024/0219495 A1 Jul. 4, 2024

(30) Foreign Application Priority Data

Dec. 28, 2022 (EP) ..................................... 22216988

(51) Int. Cl.
*G01R 33/38* (2006.01)
*G01R 33/385* (2006.01)
*G01R 33/3873* (2006.01)

(52) U.S. Cl.
CPC ....... *G01R 33/3873* (2013.01); *G01R 33/385* (2013.01)

(58) Field of Classification Search
CPC ........................... G01R 33/3873; G01R 33/385
See application file for complete search history.

(56) References Cited

U.S. PATENT DOCUMENTS

| | | | | |
|---|---|---|---|---|
| 5,550,472 | A | * | 8/1996 | Richard ............. G01R 33/3873 |
| | | | | 324/319 |
| 5,786,695 | A | | 7/1998 | Amor et al. |
| 2021/0181280 | A1 | * | 6/2021 | Vernickel .......... G01R 33/3873 |

FOREIGN PATENT DOCUMENTS

| | | | |
|---|---|---|---|
| EP | 0737867 | A1 | 10/1996 |
| EP | 3457158 | A1 | 3/2019 |
| JP | 2012115474 | A * | 6/2012 |

OTHER PUBLICATIONS

Machine translation of JP-2012115474 (Year: 2012).*

* cited by examiner

*Primary Examiner* — G.M. A Hyder
(74) *Attorney, Agent, or Firm* — Banner & Witcoff, Ltd.

(57) ABSTRACT

A shim tray designed to be pushed into a shim tray receptacle of a gradient coil unit may elongated and have a length in a longitudinal direction, a height in a radial direction and a width in a circumferential direction. The shim tray may include at least two shim pockets each configured to accommodate at least two shim plates, and at least two shim plates arranged one above the other in a radial direction in one of the shim pockets. The surfaces of the at least two shim plates may have an insulating coating.

20 Claims, 8 Drawing Sheets

SHIM TRAY FOR A GRADIENT COIL UNIT

CROSS REFERENCE TO RELATED APPLICATIONS

This patent application claims priority to European Patent Application No. 22216988.0, filed Dec. 28, 2022, which is incorporated herein by reference in its entirety.

BACKGROUND

Field

The disclosure relates to a shim tray, a gradient coil unit and a magnetic resonance device.

Related Art

In a magnetic resonance device, the body of an examination object, in particular a patient, which requires to be examined is usually exposed to a relatively high main magnetic field, e.g. 1.5 or 3 or 7 Tesla, by means of a main magnet. In addition to this, gradient pulses are output by means of a gradient coil unit. High-frequency pulses, e.g. excitation pulses, are then transmitted via a high-frequency antenna unit by means of suitable antenna entities, whereby the nuclear spins of specific atoms which are resonantly excited by these high-frequency pulses are tilted about a defined flip angle relative to the magnetic field lines of the main magnetic field. During the relaxation of the nuclear spins, high-frequency signals (so-called magnetic resonance signals) are emitted, to be received by means of suitable high-frequency antennas and then processed further. The desired image data can subsequently be reconstructed from the raw data acquired thus.

For a specific measurement, it is therefore necessary to transmit a specific magnetic resonance control sequence (MR control sequence), also referred to as a pulse sequence, which consists of a sequence of high-frequency pulses, e.g. excitation pulses and refocusing pulses, as well as corresponding gradient pulses that are to be transmitted in a coordinated manner on various gradient axes along various spatial directions. Temporally corresponding readout windows are set, which readout windows specify the time periods during which the induced magnetic resonance signals are captured.

In the context of magnetic resonance imaging by means of a magnetic resonance device, the homogeneity of a main magnetic field in an examination volume is very important. Even small deviations in the homogeneity can cause significant deviations in a frequency distribution of the nuclear spins, which can reduce the quality of the magnetic resonance image data.

Shim units are routinely used to improve the homogeneity in the examination volume. Once a magnetic resonance device is installed in its place of use, fields that are present in the environment can reduce the homogeneity of the main magnetic field, in particular around an isocenter of the magnetic resonance device. Therefore, during installation and commissioning of a magnetic resonance device, often in conjunction with measurements, the shim unit is so adjusted as to produce as far as possible an optimum homogeneity. The shim unit typically comprises at least one shim tray, at least one shim tray receptacle and at least one shim plate.

The shim unit is usually integrated into the gradient coil. The gradient coil unit is typically embodied in the shape of a hollow cylinder and has, at multiple positions along the circumferential direction, elongated openings parallel to the cylinder axis, in particular parallel to the longitudinal direction. Each of such elongated openings can be referred to as a shim tray receptacle. The length of the shim tray receptacle in a longitudinal direction typically corresponds to the length of the gradient coil unit in a longitudinal direction. The shim tray receptacle can also be shorter than the gradient coil unit and, for example, have an opening which starts from only one longitudinal end of the gradient coil unit. The shim tray receptacle is typically designed to be tubular and/or in the shape of a hollow cylinder and/or hollow. The shim tray receptacle typically encloses a hollow region. The shim tray receptacle typically has a rectangular cross section or a round cross section or a cross section in the shape of an annular segment. The shim tray receptacle is typically designed to accommodate a shim tray, in particular in its opening and/or in its hollow region. The shim tray can be manually and/or mechanically positioned in the shim tray receptacle, in particular in its opening and/or in its hollow region. The shim tray is preferably flush with the shim tray receptacle in a radial direction and/or in a circumferential direction. Shim plates are arranged within the shim tray as a function of the inhomogeneity of the main magnetic field, in particular due to the surroundings. The shim plates are typically arranged at defined and individual positions within the shim tray in order to increase the homogeneity of the main magnetic field by virtue of their susceptibility. The shim plates are typically arranged outside the gradient coil unit at the corresponding position of the shim tray and together with the shim tray are placed within the shim tray receptacle, in particular pushed into the shim tray receptacle. Shim plates are conventionally made of iron.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
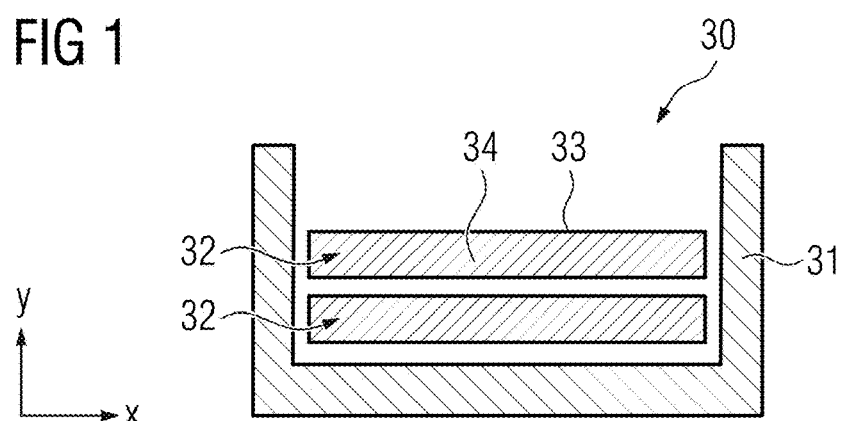
FIG. 1 shows a cross-sectional view of a shim tray according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide a space-saving shim tray.

The shim tray according to the disclosure may be configured to be pushed into a shim tray receptacle and to be elongated, having a length in a longitudinal direction, a height in a radial direction and a width in a circumferential direction. The shim tray may have at least two shim pockets, which at least two shim pockets are designed to accommodate at least two shim plates in each case. The shim tray may comprise at least two shim plates arranged one above the other in a radial direction in a shim pocket, the surfaces of the shim plates having an insulating coating. The longitudinal direction, the radial direction and the circumferential direction may relate to a cylinder axis of a hollow cylindrical gradient coil unit, and/or of a hollow cylindrical magnetic resonance device, in which the shim tray can be integrated. The longitudinal direction is typically parallel to the cylinder axis in this case.

The shim tray may be divided and/or partitioned into shim pockets in a longitudinal direction, it being possible to fill said shim pockets with shim plates according to the inhomogeneities that must be corrected in the main magnetic field. The shape and size of the shim plates is typically adapted to the size of the shim pockets, in particular in a longitudinal direction and in a circumferential direction, so that a shim plate can be seated in particular almost flush in a shim pocket. A shim pocket can be designed to accommodate at least two, in particular also three or more, shim plates which can be arranged one above the other, in particular stacked in a radial direction.

The surfaces of the shim plates have an electrically insulating coating. The surface of each individual shim plate preferably has an insulating coating. Each of the at least two shim plates is preferably surrounded by an insulating coating, and most preferably surrounded completely. The insulating coating of the shim plates can be provided in a manner which is automated and uniform, whereby a particularly high quality can be ensured. The insulating coating reliably prevents the formation of spikes between the shim plates and the shim pocket and/or between the shim plates. In particular, the insulation of the shim plates can take place independently of the filling of a shim pocket with the shim plates, whereby a process which is susceptible to errors can be avoided.

According to an embodiment variant of the shim tray, the shim tray does not have an intermediate layer between the two shim plates arranged one above the other, in particular, the two shim plates arranged one above the other lie directly one on top of the other.

The two shim plates arranged one above the other preferably have flat contact with each other. The electrical insulation between two shim plates arranged one above the other is conventionally achieved by means of a layer, in particular by means of insulating films, comprising a synthetic material. The omission of an insulating intermediate layer between the two shim plates arranged one above the other makes it possible to reduce the height of the shim tray without reducing the quantity of shim plates, in particular the quantity of the material included in the shim plates which influences the homogeneity of the main magnetic field, i.e. the magnetic effect. Furthermore, the omission of an intermediate layer reduces possible errors during the filling of a shim pocket with shim plates, and accelerates this process. This results in a more robust insulation between the individual shim plates.

The diameter of the patient receiving region in a magnetic resonance device correlates to the comfort of the patient: the greater the diameter of the high-frequency antenna unit, the greater the comfort for the patient. The high-frequency antenna unit, the gradient coil unit and the superconducting magnet for generating the main magnetic field, i.e. the main magnet, are typically arranged concentrically relative to each other. The larger the internal diameter of the main magnet, the less efficiently the main magnetic field can be generated and the more measures and costs are required in order to produce sufficient homogeneity in the main magnetic field. It is therefore desirable for in particular those units which are arranged within the main magnet, in particular the high-frequency antenna unit and the gradient coil unit, to have the smallest possible wall thickness. This embodiment variant of the shim tray allows a particularly flat arrangement of the shim plates for the same magnetic effect.

According to an embodiment variant of the shim tray, the at least two shim plates each have a shim core comprising metal, in particular iron, and the insulating coating is characterized by at least one of the following features:

passivized surface of the shim core
phosphatized surface of the shim core
lacquer
vapor deposition at the surface of the shim core.

The shim plates preferably comprise a semifinished product. The insulating coating is preferably designed as an insulating seal of the surface. The thickness of the insulating coating can be less than 100 μm. The insulating coating can be applied to the surface of the shim core in the form of a lacquer. The insulating coating can comprise a lamination of the shim core and/or an application of film to the shim core. The insulating coating can be produced by means of passivation of the surface of the shim core. The insulating coating can be produced by means of phosphatization of the surface of the shim core. The insulating coating can be produced by means of vapor deposition, in particular by means of chemical vapor deposition or physical vapor deposition, at the surface of the shim core. The shim core must be reliably treated using such insulating coatings and must be completely insulated. Spike suppression can reliably be ensured thereby.

According to an embodiment variant of the shim tray, the shim tray has a height in a radial direction of less than 10 mm. The shim tray typically has a height in a radial direction between 3 mm and 10 mm, preferably between 4 mm and 8 mm, most preferably between 5 mm and 7 mm. The shim tray typically has a width in a circumferential direction between 5 mm and 100 mm, preferably between 10 mm and 50 mm, most preferably between 20 mm and 40 mm. The shim tray typically has a length in a longitudinal direction between 700 mm and 2000 mm, preferably between 800 mm and 1800 mm, most preferably between 1000 mm and 1600 mm. This embodiment variant allows shimming of the main magnetic field in a particularly space-saving manner.

According to an embodiment variant of the shim tray, the shim tray is shaped in such a way that it has a rectangular cross section perpendicular to the longitudinal direction. The shim tray can be arranged within or at the gradient coil unit. The shim tray can be arranged within or at the high-frequency antenna unit. The shim tray can be arranged between the high-frequency antenna unit and the gradient coil unit. In all of these arrangements, the width of the shim tray in a circumferential direction is typically less than 10% of the diameter of the high-frequency antenna unit and/or gradient coil unit. Consequently, and in particular if the width of the shim tray is small, no curvature of the shim tray is necessary in a circumferential direction. In particular, a shim tray having a rectangular cross section perpendicular to the longitudinal direction can be manufactured in a robust and simple manner.

According to an embodiment variant of the shim tray, the shim tray is shaped in such a way that it has a cross section which corresponds to an annular segment perpendicular to the longitudinal direction. The curvature of the annular segment is preferably adapted to the curvature of the high-frequency antenna unit and/or gradient coil unit in a circumferential direction. The shim tray can also be shaped as an annular segment on one side only. In the case of low height in particular, i.e. if the high-frequency antenna unit and/or gradient coil unit has a small wall thickness, this embodiment variant allows the use of a relatively wide shim tray in a circumferential direction. It is thereby possible in particular to use larger shim plates, whereby in particular large inhomogeneities of the main magnetic field can be corrected. Furthermore, such a shim tray is particularly well held in the corresponding shim tray receptacle.

According to an embodiment variant of the shim tray, the shim tray comprises a carrier plate on which the shim pockets are arranged. The carrier plate is typically designed to stabilize the shim pockets, in particular in a longitudinal direction. The carrier plate preferably has greater stiffness than the shim pockets. The carrier plate typically has greater height, i.e. a greater spatial extent in a radial direction, than a wall and/or partition of a shim pocket in a longitudinal direction. The shim pockets are typically so embodied as to be suitable for accommodating shim plates and/or can prevent the shim plates from falling out. The stability of the shim tray, which is required in order to push the shim tray into the shim tray receptacle, is preferably provided by the carrier plate. The carrier plate can therefore serve to stiffen the shim pockets, in particular against deflection, and/or to provide the mechanical stability of the shim tray. In particular, the carrier plate can comprise solid plastic. This embodiment variant allows a particularly robust shim tray.

According to an embodiment variant of the shim tray, the carrier plate and/or the shim pockets comprise glass-fiber reinforced plastic (GFRP) or carbon-fiber reinforced plastic (CFRP). According to this embodiment variant, with the exception of the shim plates, all parts of the shim tray are preferably made from GFRP or CFRP. GFRP and/or CFRP are particularly robust and stable plastics, offering particular resilience and stability with regard to vibration and torsional moment. Moreover, GFRP and/or CFRP are electrically insulating, thereby reducing eddy currents and/or electromagnetic interference with the shim plates. This allows a shim tray with a particularly thin carrier plate at the same time as high stability.

According to an embodiment variant of the shim tray, the carrier unit comprises a stiffening unit. The stiffening unit is preferably designed in such a way that it increases the stability of the carrier plate and therefore the shim tray. The carrier plate preferably has a greater width in a circumferential direction than the shim pocket and therefore projects beyond the shim pockets laterally. The stiffening unit can be arranged in precisely these regions of the lateral projection. The stiffening unit is preferably designed to be elongated in a longitudinal direction. This allows a shim tray with a particularly thin carrier plate at the same time as high stability.

According to an embodiment variant of the shim tray, the stiffening unit comprises a honeycomb structure and/or a rod form and/or GFRP and/or CFRP. The honeycomb structure and/or the rod form are preferably so designed as to be elongated in a longitudinal direction. The honeycomb structure and/or the rod form are preferably arranged at the sides of the shim pockets. The rod form preferably has a rectangular cross section perpendicular to the longitudinal direction. This allows a shim tray with a particularly thin carrier plate at the same time as high stability.

The disclosure further relates to a gradient coil unit having a shim tray receptacle which is designed to accommodate a shim tray according to the disclosure. The shim tray can preferably be pushed into the shim tray receptacle manually. The dimensions of the shim tray receptacle, in particular in a radial direction and in a circumferential direction, are preferably compatible with the dimensions of the shim tray, such that this can be arranged largely flush within the shim tray receptacle. The gradient coil unit is designed in the shape of a hollow cylinder and has at least one opening in a longitudinal direction, which opening can serve as a shim tray receptacle. The gradient coil unit typically comprises at least four, preferably at least eight, most preferably at least twelve shim tray receptacles, which are arranged at various positions in a circumferential direction and are each so embodied as to be elongated and run parallel to the longitudinal direction and/or cylinder axis. The shim tray receptacles comprised in the gradient coil unit are preferably distributed uniformly in a circumferential direction and/or arranged symmetrically.

An embodiment variant of the gradient coil unit comprises a primary coil unit for generating a magnetic field gradient and does not have a secondary coil unit. The primary coil unit can comprise three primary coils, each one of said three primary coils being designed to generate a magnetic field gradient respectively in one of three reciprocally orthogonal spatial directions. The primary coil unit is typically designed to generate a magnetic field gradient in the patient receiving region.

Conventionally, the effect of the primary coil unit outside the patient receiving region is largely suppressed by a secondary coil unit that is assigned to the primary coil unit. The secondary coil unit conventionally surrounds the corresponding primary coil unit in a concentric manner. The greater the radial separation between the primary coil unit and a conventional secondary coil unit, the smaller the effect of eddy currents of a higher order on the primary coil unit, thereby improving the homogeneity of the magnetic field gradient which is generated by the gradient coil unit. The radial separation between the primary coil unit and a conventional secondary coil unit can therefore be used in the case of a conventional gradient coil unit for the integration of shim tray receptacles, without the diameter of the patient receiving region being influenced thereby. If the gradient coil unit does not have a secondary coil unit, the height of the shim tray can have an effect on the diameter of the patient receiving region, which can be reduced by the height of the shim tray in a radial direction. A shim tray having particularly limited height, such as the shim tray according to the disclosure, is therefore particularly advantageous for this embodiment variant of the gradient coil unit.

The disclosure further relates to a magnetic resonance device comprising a main magnet, a high-frequency antenna unit, a gradient coil unit, a shim tray receptacle and a shim tray according to the disclosure. According to the disclosure, the shim tray receptacle can be integrated into the gradient coil unit.

According to an embodiment variant of the magnetic resonance device, the shim tray and the shim tray receptacle are arranged between the main magnet and the gradient coil unit or between the gradient coil unit and the high-frequency antenna unit or integrated into the high-frequency antenna unit.

Exemplary embodiments of the magnetic resonance device and the gradient coil unit are designed in accordance with the exemplary embodiments of the shim tray. The advantages of the magnetic resonance device and of the gradient coil unit correspond essentially to the advantages of the shim tray, which are explained in detail above. Features, advantages or alternative embodiments cited in this context can likewise be transferred to the other embodiment(s) and vice versa.

FIG. 1 shows a first embodiment of a shim tray 30 in a schematic diagram in a first (cross-sectional) view. The shim tray 30 may be configured as to be elongated, having a length in a longitudinal direction z, a height in a radial direction r corresponding to the y-direction in the illustrated case, and a width in a circumferential direction corresponding to the x-direction in the illustrated case. The Cartesian coordinates specified here correspond to the cylinder coordinates of the magnetic resonance device 11 and/or the gradient coil unit 19 when the shim tray 30 is arranged in the highest vertical position.

The shim tray 30 may have at least two shim pockets 31, of which the cross section of only one individual shim pocket 31 is illustrated in the first view illustrated. A shim pocket 31 may be designed to accommodate at least two shim plates 32 in each case. The shim pocket 31 illustrated in a simplified manner in FIG. 1 may be designed to accommodate three shim plates 32, two shim plates 32 being arranged one above the other, in particular one on top of the other, in the embodiment variant illustrated. Each shim plate 32 comprises an insulating coating 33 at the surface, which insulating coating 33 preferably surrounds a shim core 34. The two shim plates 32, or all of the shim plates 32 arranged one above the other in the shim pocket 31, preferably lie one on top of the other, typically being in direct contact with each other and/or without a layer between them, in particular without an intermediate layer and/or a distance holder. The separation that is illustrated in the FIGS. 1 to 4 and 6 between adjacent shim plates 32 merely serves to illustrate the individual shim plates 32 more clearly. In fact, the shim plates 32 preferably lie directly on top of each other and/or the lowest shim plate 32 preferably lies directly on the floor of the shim pocket 31. The separation that is illustrated in the FIGS. 1 to 7 between a shim plate 32 and a shim pocket 31 accommodating the shim plate 32 merely serves to illustrate the individual shim plate 32 more clearly. In fact, the shim plates 32 may lie flush with the shim pocket 31 and/or have a size and/or shape that may be adapted to the size and/or shape of the shim pocket 31, such that the separation is in particular less than 5 mm, preferably less than 3 mm, most preferably less than 1 mm.

The two shim plates 32 may each comprise a shim core 34 which may be made of metal, in particular iron. The height, i.e. the spatial extent of the shim tray 30 in a radial direction, i.e. in a y-direction in the illustrated case, is preferably less than 10 mm, most preferably between 4 mm and 8 mm. The width, i.e. the spatial extent of the shim tray 30 in a circumferential direction, i.e. in an x-direction in the illustrated case, is typically between 5 mm and 70 mm, preferably between 10 mm and 50 mm, most preferably between 20 mm and 40 mm. The length, i.e. the spatial extent of the shim tray 30 in a longitudinal direction z, is typically between 700 mm and 2000 mm, preferably between 800 mm and 1800 mm, most preferably between 1000 mm and 1600 mm. The cross section of the shim tray 30 illustrated in FIG. 1 corresponds to the view of a sectional plane perpendicular to the longitudinal direction z and represents a rectangular shape of the shim tray 30.

Figure 2:
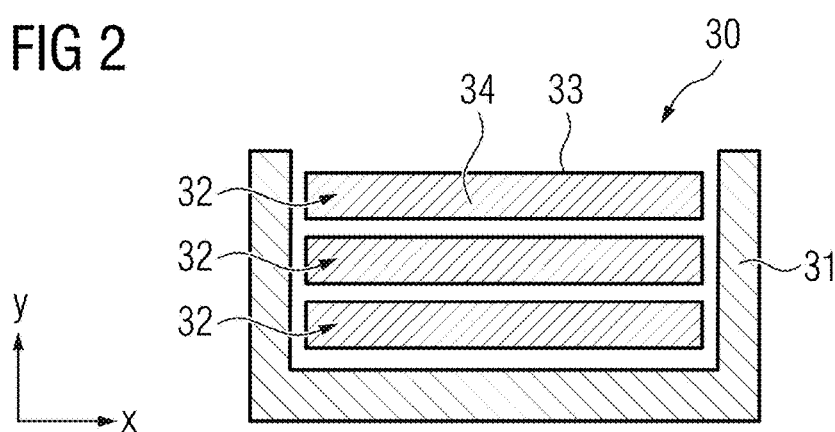
FIG. 2 shows a cross-sectional view of a shim tray according to an exemplary embodiment of the disclosure.

FIG. 2 shows a second embodiment variant of a shim tray 30 in a schematic diagram in a first view. The second embodiment variant differs from the first embodiment variant solely in that three shim plates 32 are arranged in the shim pocket 31.

Figure 3:
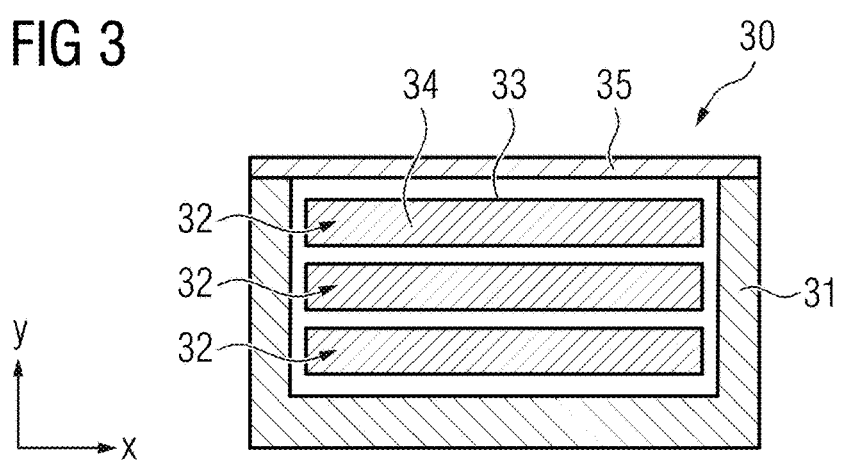
FIG. 3 shows a cross-sectional view of a shim tray according to an exemplary embodiment of the disclosure.

FIG. 3 shows a third embodiment variant of a shim tray 30 in a schematic diagram in a first view. The third embodiment variant differs from the second embodiment variant of a shim tray 30 as per FIG. 2 in that the shim tray 30, in particular the shim pocket 31 and shim plates 32 positioned therein, may be covered by a shim pocket cover 35. The shim pocket cover 35 may be configured to cover one or more of the shim pockets 31.

Figure 4:
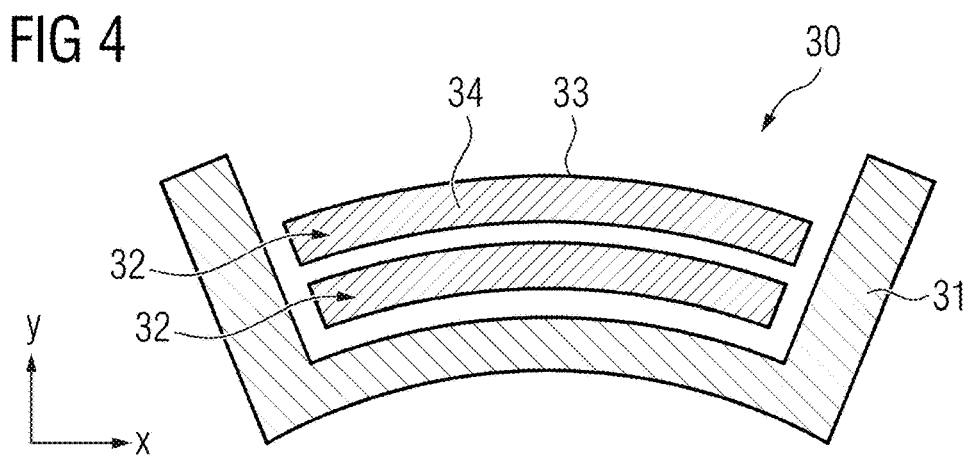
FIG. 4 shows a cross-sectional view of a shim tray according to an exemplary embodiment of the disclosure.

FIG. 4 shows a fourth embodiment variant of a shim tray 30 in a schematic diagram in a first view. The fourth embodiment differs from the first embodiment variant in particular in that the shim tray 30 may be shaped in such a way that it has a cross section corresponding to an annular segment perpendicular to the longitudinal direction z.

Figure 5:
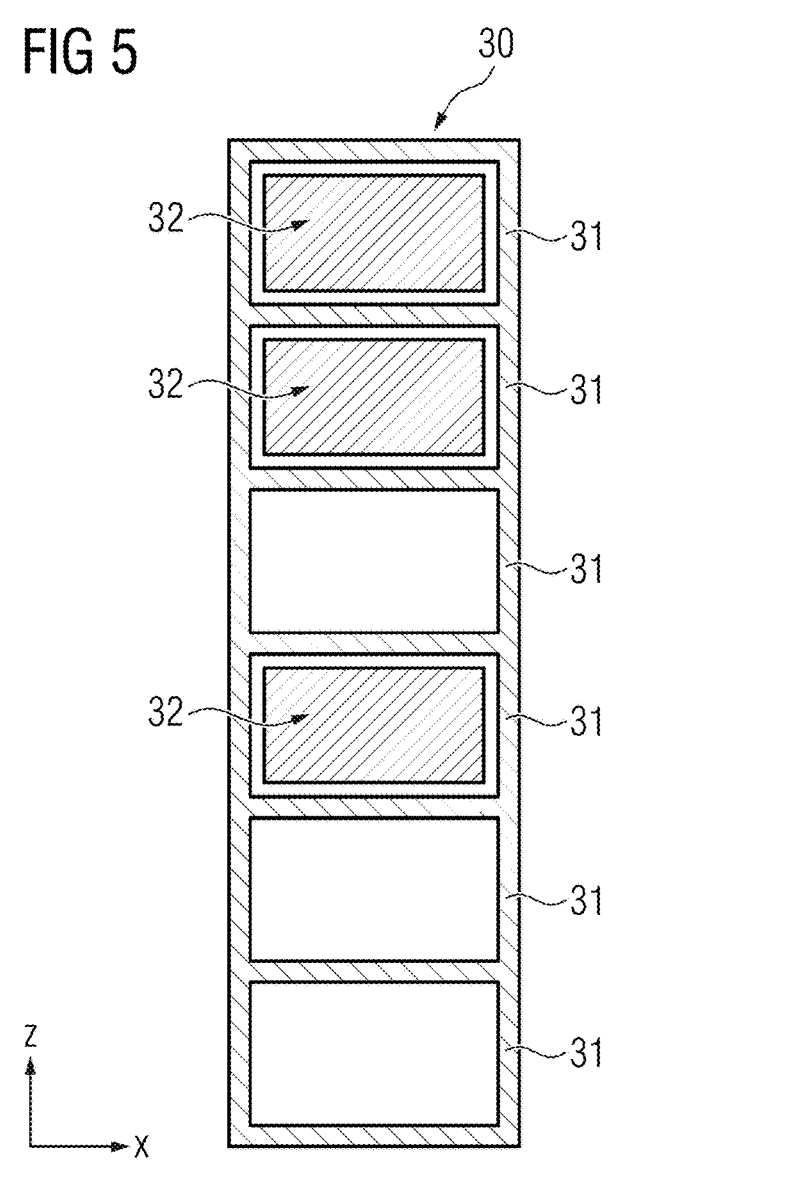
FIG. 5 shows a top view of a shim tray according to an exemplary embodiment of the disclosure.

FIG. 5 shows a fifth embodiment variant of a shim tray 30 in a schematic diagram in a second view. The embodiment variants of the shim tray 30 illustrated in the FIGS. 1, 2 and 4 can correspond to the fifth embodiment variant, and the respective first view of the FIGS. 1 and/or 2, or 4 can represent a sectional plane perpendicular to the longitudinal direction z through a shim pocket 31 which is occupied by at least two shim plates 32. The shim tray 30 typically comprises a plurality of shim pockets 31 which are distinct from each other in a longitudinal direction z, in particular being arranged one behind the other in a longitudinal direction z. The plurality of shim pockets 31 of a shim tray 30 preferably have the same position in a circumferential direction, in an x-direction in the illustrated case. The individual shim pockets 31 of a shim tray 30 can be occupied by differing numbers of shim plates 32. In particular, it is possible for at least one shim pocket 31 to contain no shim plates 32.

Figure 6:
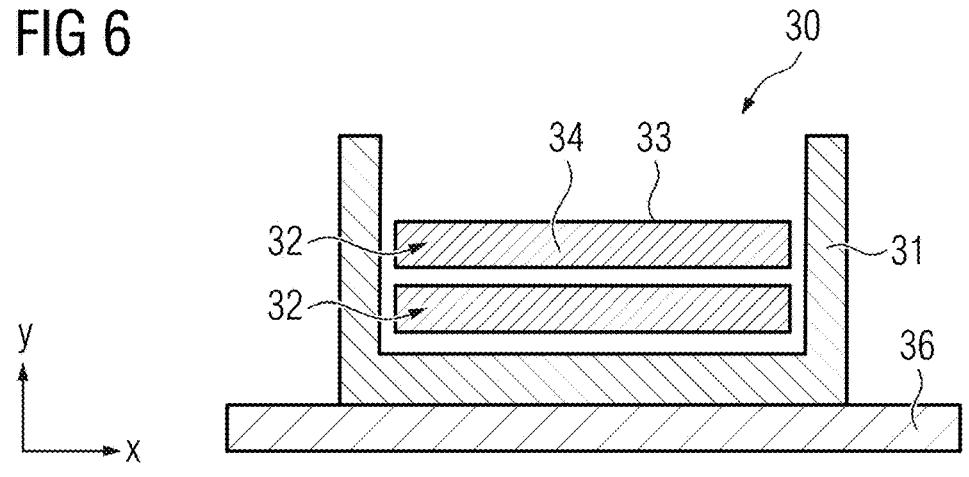
FIG. 6 shows a cross-sectional view of a shim tray according to an exemplary embodiment of the disclosure.

FIG. 6 shows a sixth embodiment variant of a shim tray 30 in a schematic diagram in a first view. This embodiment variant differs from the first embodiment variant of the shim tray 30 illustrated in FIG. 1 in that the shim tray 30 comprises a carrier plate 36, the shim pockets 31 being arranged on said carrier plate 36.

Figure 7:
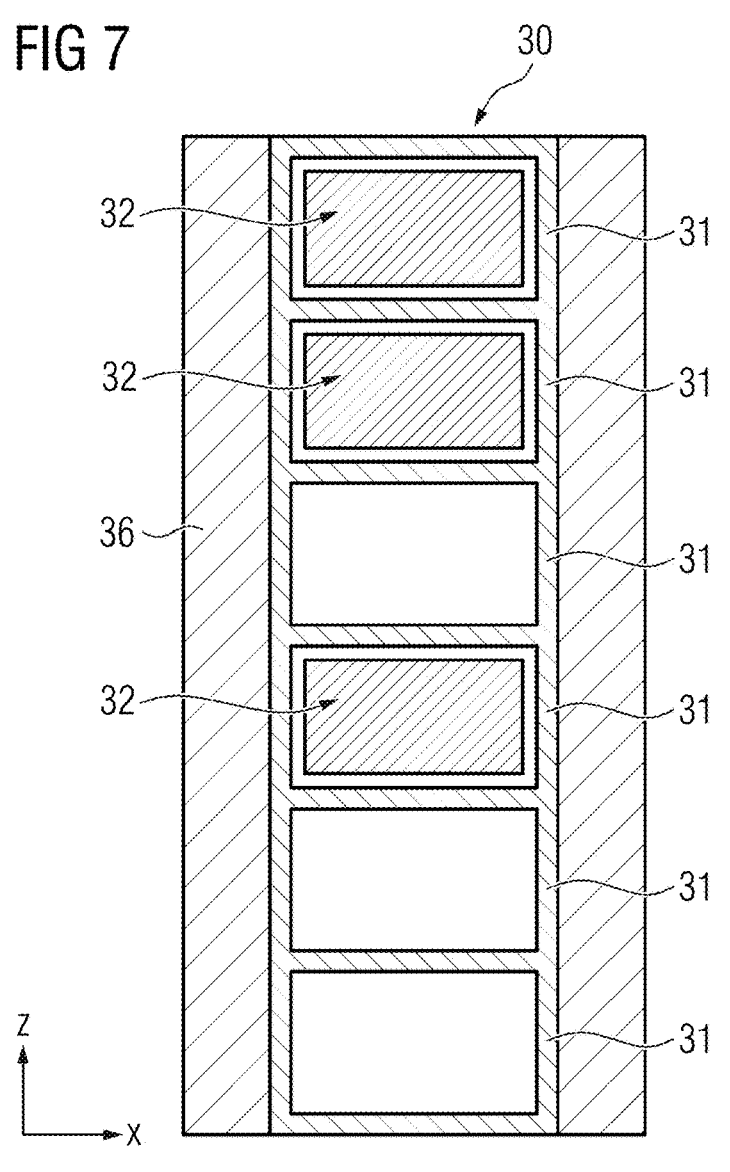
FIG. 7 shows a top view of a shim tray according to an exemplary embodiment of the disclosure.

FIG. 7 shows the sixth embodiment variant of a shim tray 30 in a second view. According to this embodiment variant, the carrier plate 36 has a greater width than the shim pockets 31. Alternatively, the width of the carrier plate 36 can correspond to the width of a shim pocket 31 or be smaller than this.

Figure 8:
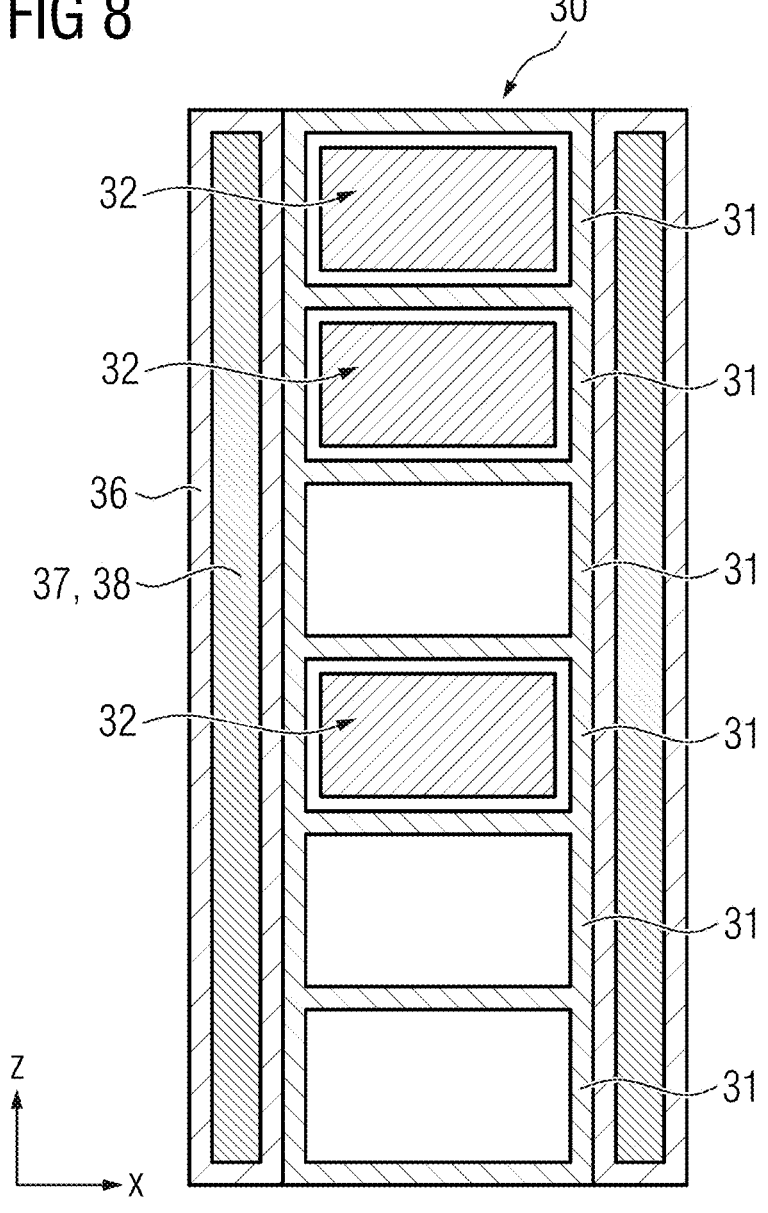
FIG. 8 shows a top view of a shim tray according to an exemplary embodiment of the disclosure.

FIG. 8 shows a seventh embodiment variant of a shim tray 30 in a schematic diagram in a second view. The seventh embodiment variant differs from the sixth embodiment variant of the shim tray 30 illustrated in FIG. 7, in particular in that the carrier unit 36 comprises a stiffening unit 37. According to this embodiment variant the stiffening unit 37 may be designed in rod form 38 and/or comprises GFRP and/or CFRP.

Figure 9:
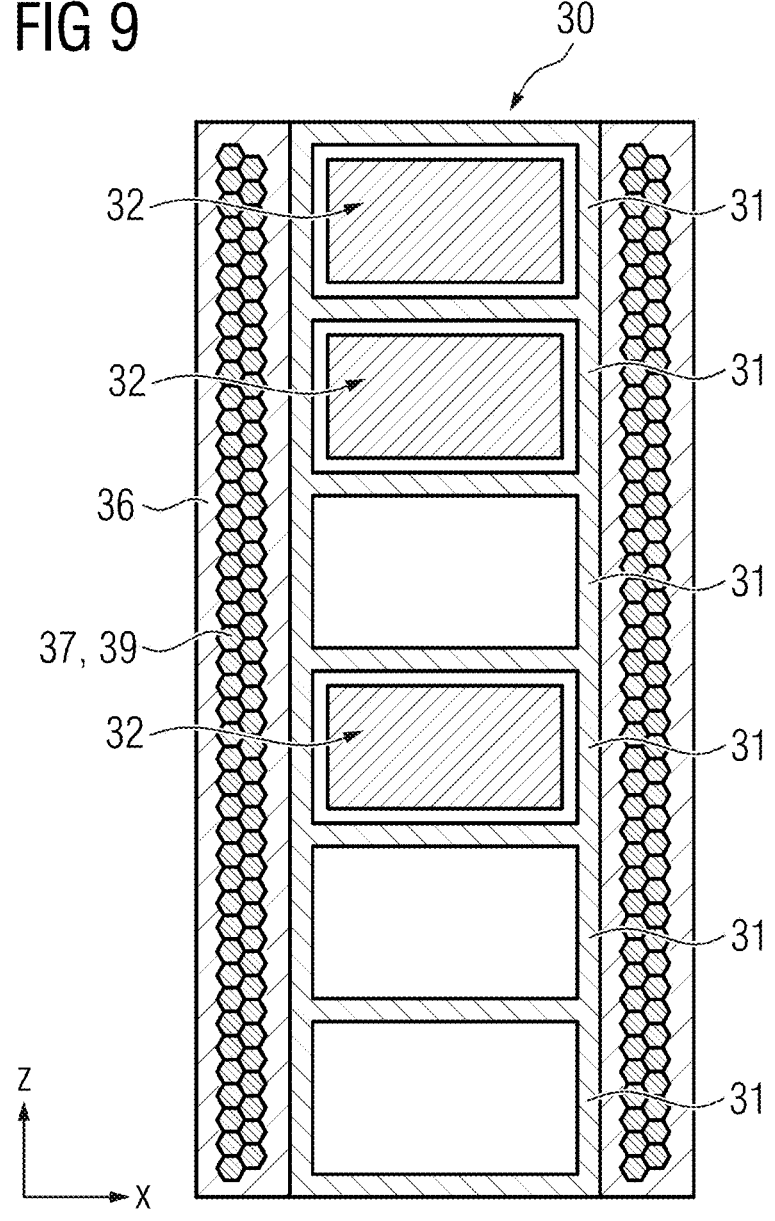
FIG. 9 shows a top view of a shim tray according to an exemplary embodiment of the disclosure.

FIG. 9 shows an eighth embodiment variant of a shim tray in a schematic diagram in a second view. The eighth embodiment variant differs from the sixth embodiment variant of the shim tray 30 illustrated in FIG. 7, in particular in that the carrier unit 36 comprises a stiffening unit 37. According to this embodiment variant, the stiffening unit 37 may be designed as a honeycomb structure 39.

Figure 10:
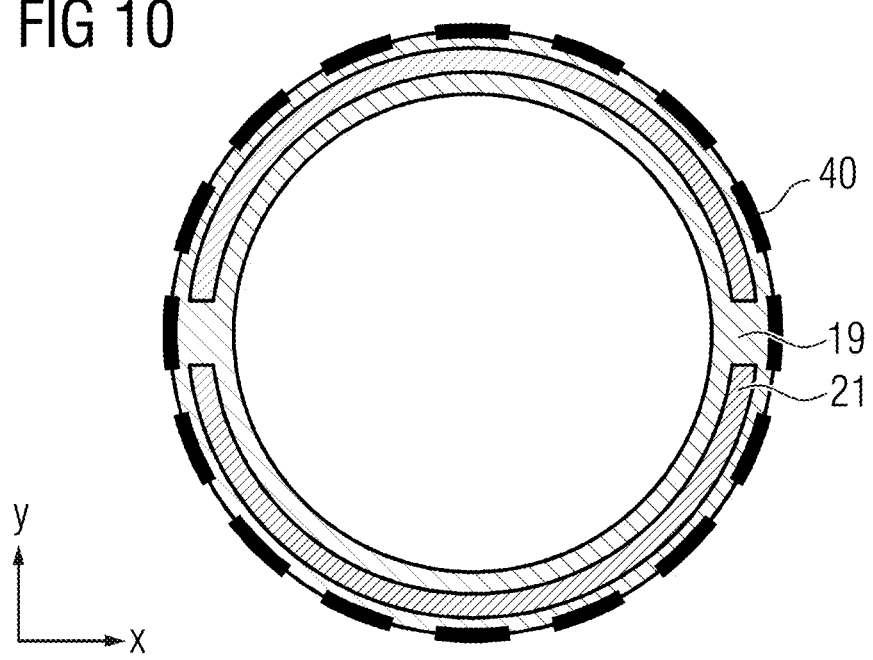
FIG. 10 shows a cross-sectional view of a gradient coil unit according to an exemplary embodiment of the disclosure.

FIG. 10 shows a first embodiment variant of a gradient coil unit 19 according to the disclosure in a schematic diagram. The gradient coil unit 19 may be designed in the shape of a hollow cylinder and has a shim tray receptacle 40, said shim tray receptacle 40 being suitable for accommodating a shim tray 30 according to the disclosure. The gradient coil unit 19 typically has a plurality of shim tray receptacles 40, these having the same radial distance from the cylinder axis of the gradient coil unit and differing in their position in a circumferential direction. A shim tray 30 according to the disclosure can typically be positioned respectively in each of the plurality of shim tray receptacles 40. The gradient coil unit 19 typically has a primary coil unit 21 for generating a magnetic field gradient. The gradient coil unit 19 preferably does not have a secondary coil unit.

Figure 11:
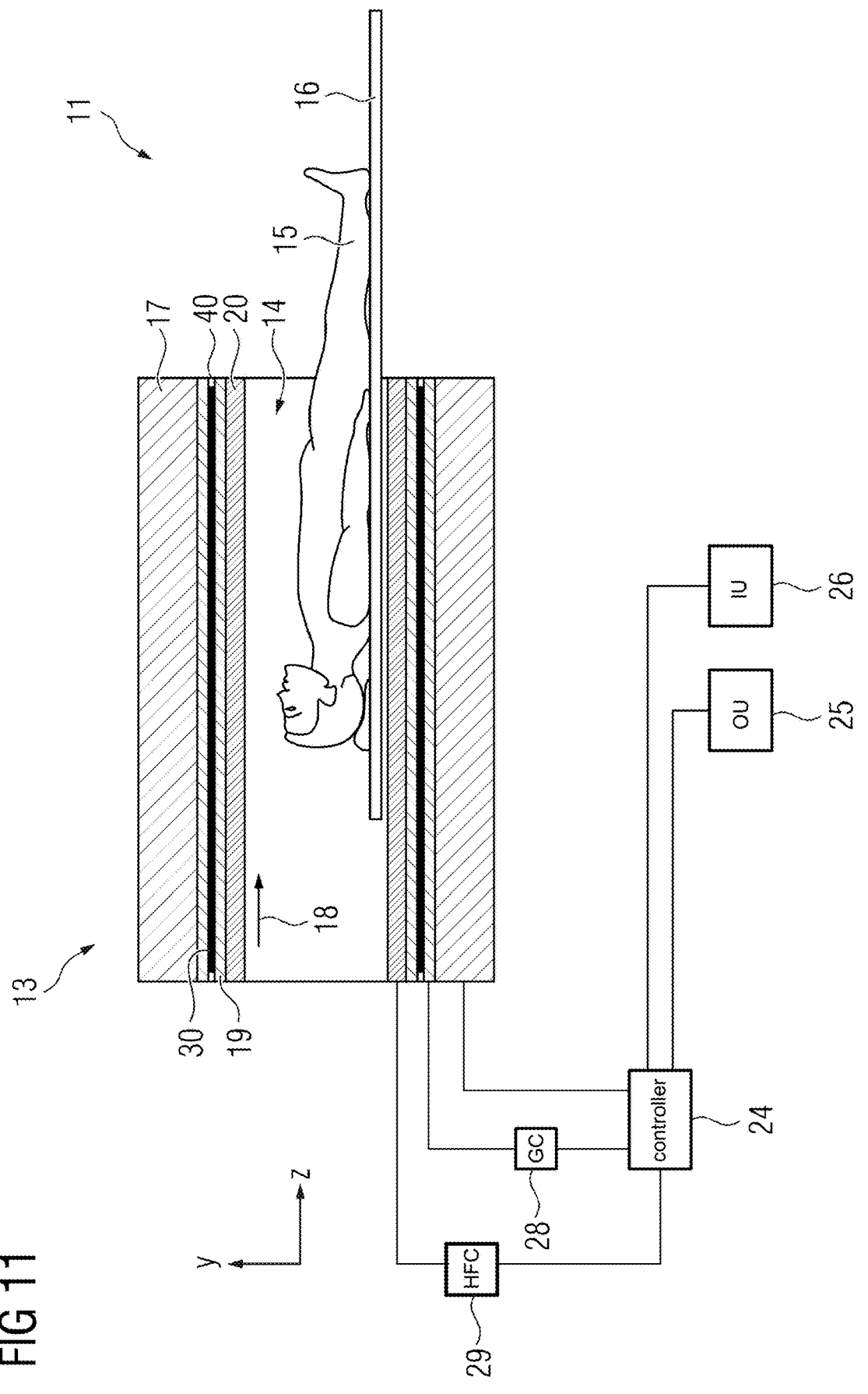
FIG. 11 shows a magnetic resonance device according to an exemplary embodiment of the disclosure.

FIG. 11 shows a first embodiment variant of a magnetic resonance device 11 in a schematic diagram in a first view. The magnetic resonance device 11 comprises a detector unit (scanner) 13 with a main magnet 17 for generating a strong and in particular constant main magnetic field 18 parallel to the longitudinal direction z, in particular parallel to the cylinder axis. In addition, the magnetic resonance device 11 has a cylindrical patient receiving region 14 for receiving a patient 15, where the patient receiving region 14 being cylindrically enclosed in a circumferential direction by the detector unit 13. The patient 15 can be pushed into the patient receiving region 14 by means of a patient support device 16 of the magnetic resonance device 11. For this purpose, the patient support device 16 has a patient table which is so arranged as to be mobile within the magnetic resonance device 11. The detector unit 13 also has a high-frequency antenna unit 20, which may be designed here as a body coil that may be permanently integrated into the magnetic resonance device 11, and a high-frequency antenna controller 29 for exciting a polarization which may be obtained in the main magnetic field 18 that is generated by the main magnet 17. The high-frequency antenna unit 20 is activated by the high-frequency antenna controller 29 and directs high-frequency pulses into an examination volume which may be substantially formed by the patient receiving region 14.

Furthermore, the detector unit 13 has a gradient coil unit 19 which may be used for spatial encoding during imaging. The gradient coil unit 19 may be activated by means of a gradient controller 28. The detector unit 13, in particular the gradient coil unit 19 in the embodiment variant illustrated in FIG. 11, also has a shim tray receptacle 40 which may be designed to accommodate a shim tray 30 according to the disclosure.

For the purpose of controlling the main magnet 17, the gradient controller 28 and the high-frequency antenna controller 29, the magnetic resonance device 11 has a controller 24. The controller 24 may be configured to control the magnetic resonance device 11 centrally, e.g. the implementation of MR control sequences. The magnetic resonance device 11 has an output unit 25 (e.g., a display, speaker, etc.). The magnetic resonance device 11 also has an input unit 26 (e.g., keyboard, mouse, etc.), by means of which information and/or control parameters can be input by a user during a measuring operation. The input unit 26 and the output unit 25 may be collectively formed by, for example, a computer or other computing device. The controller 24 can comprise the gradient controller 28 and/or the high-frequency antenna controller 29 and/or the display unit 25 and/or the input unit 26. In an exemplary embodiment, one or more of the controllers 24, 28, 29 may include processing circuitry that is configured to perform one or more respective operations and/or functions of the controller(s). Additionally, or alternatively, one or more components of the controller(s) 24, 28, 29 may include processing circuitry that is configured to perform one or more operations and/or functions of the respective component(s).

The illustrated magnetic resonance device 11 can obviously comprise further components which are customarily associated with magnetic resonance devices 11. The way in which a magnetic resonance device 11 generally functions is moreover known to a person skilled in the art, and therefore a detailed description of the further components is omitted here.

Figure 12:
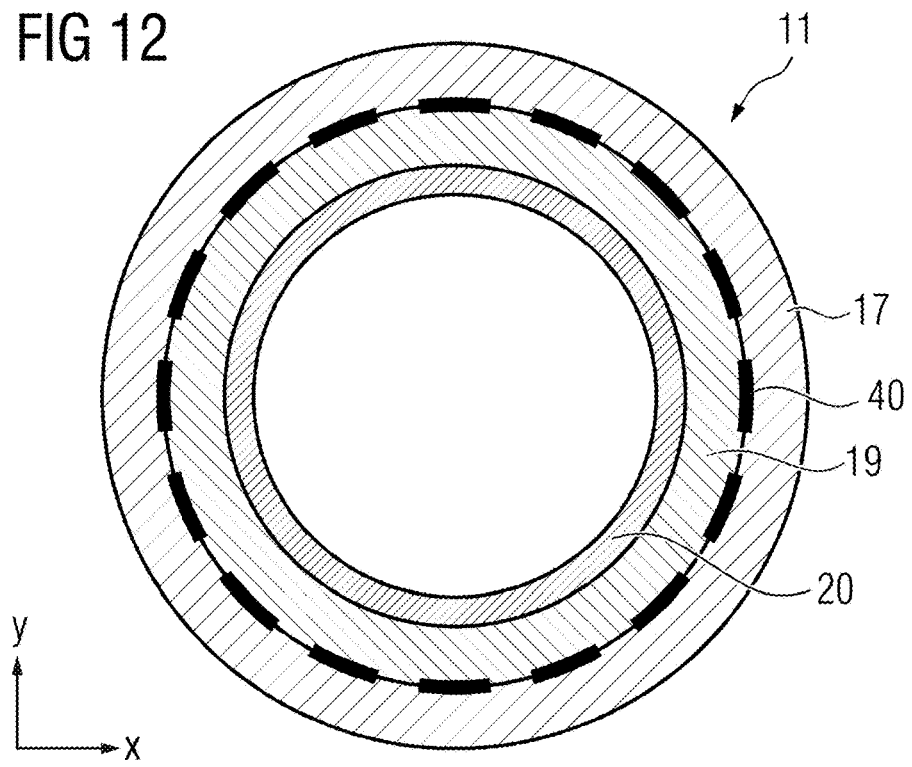
FIG. 12 shows a cross-sectional view of a magnetic resonance device according to an exemplary embodiment of the disclosure.

FIG. 12 shows a second embodiment variant of a magnetic resonance device in a schematic diagram in a second view. According to the second embodiment variant, the magnetic resonance device has a plurality of shim tray receptacles 40 and shim trays 30 positioned therein. According to the second embodiment variant, the shim tray receptacles 40 and the shim trays 30 are arranged between the main magnet 17 and the gradient coil unit 19.

Figure 13:
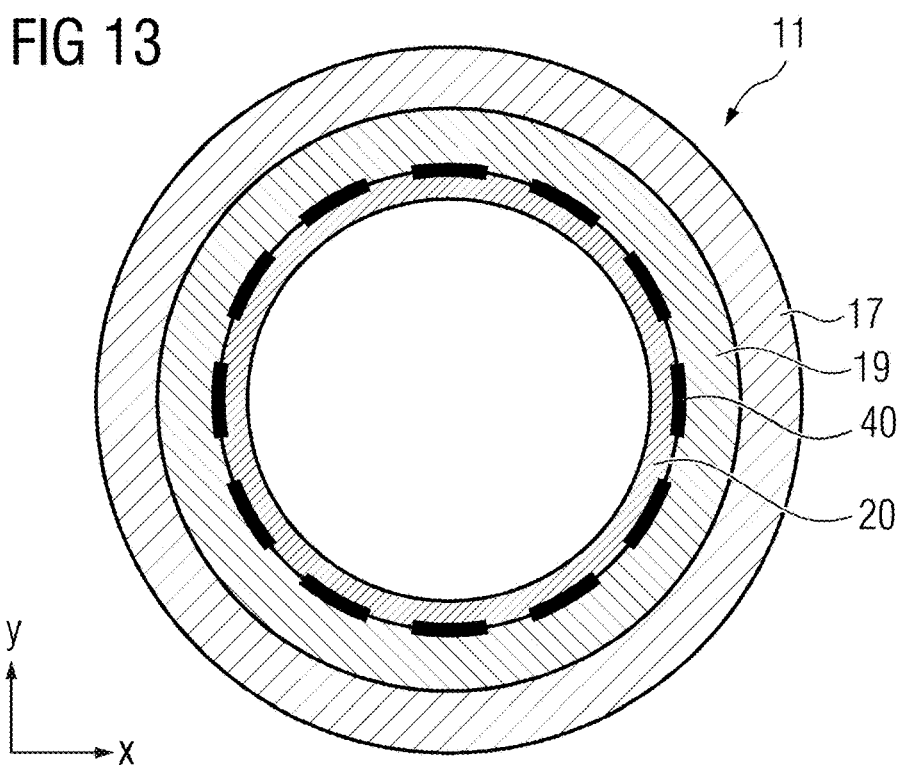
FIG. 13 shows a cross-sectional view of a magnetic resonance device according to an exemplary embodiment of the disclosure.

FIG. 13 shows a third embodiment variant of a magnetic resonance device in a schematic diagram in a second view. According to the third embodiment variant, the magnetic resonance device has a plurality of shim tray receptacles 40 and shim trays 30 positioned therein. According to the third embodiment variant, the shim tray receptacles 40 and the shim trays 30 are arranged between the gradient coil unit 19 and the high-frequency antenna unit 20. At the same time or alternatively, the shim tray receptacles 40 and the shim trays 30 can be arranged such that they are integrated into the high-frequency antenna unit 20.

Although the disclosure is illustrated and described above in detail with reference to the preferred exemplary embodiments, the disclosure is not restricted by the examples disclosed herein and other variations may be derived therefrom by a person skilled in the art without departing from the scope of the disclosure. Independent of the grammatical term usage, individuals with male, female or other gender identities are included within the term.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A shim tray configured to be pushed into a shim tray receptacle and to be elongated, having a length in a longitudinal direction, a height in a radial direction and a width in a circumferential direction, the shim tray comprising:

at least two shim pockets each configured to accommodate at least two shim plates; and at least two shim plates each comprising a shim core, the at least two shim plates being arranged one above the other in the radial direction in one of the at least two shim pockets, wherein surfaces of the at least two shim plates have an insulating coating that is a phosphatized surface of the shim core.

2. The shim tray as claimed in claim 1, wherein the shim tray is free of an intermediate layer between the at least two shim plates arranged one above the other.

3. The shim tray as claimed in claim 2, wherein the at least two shim plates arranged one above the other lie directly on top of each other.

4. The shim tray as claimed in claim 1, wherein the respective shim cores comprise metal, the insulating coating further being:

a passivized surface of the shim core, a lacquer, and/or a vapor deposition at the surface of the shim core.

5. The shim tray as claimed in claim 1, wherein the shim tray has a height in a radial direction of less than 10 mm.

6. The shim tray as claimed in claim 1, wherein the shim tray is shaped such that the shim tray has a rectangular cross section perpendicular to the longitudinal direction.

7. The shim tray as claimed in claim 1, wherein the shim tray is shaped such that the shim tray has a cross section corresponding to an annular segment perpendicular to the longitudinal direction.

8. The shim tray as claimed in claim 1, wherein the shim tray comprises a carrier plate on which the at least two shim pockets are arranged.

9. The shim tray as claimed in claim 8, wherein the carrier plate and/or the shim pockets comprise glass-fiber reinforced plastic (GFRP) or carbon-fiber reinforced plastic (CFRP).

10. The shim tray as claimed in claim 8, wherein the carrier unit comprises a stiffening unit.

11. The shim tray as claimed in claim 10, wherein the stiffening unit comprises a honeycomb structure and/or a rod form.

12. The shim tray as claimed in claim 10, wherein the stiffening unit comprises glass-fiber reinforced plastic (GFRP) and/or carbon-fiber reinforced plastic (CFRP).

13. The shim tray as claimed in claim 1, wherein the respective shim cores comprise metal.

14. A gradient coil unit comprising:

a shim tray receptacle configured to accommodate a shim tray having a length in a longitudinal direction, a height in a radial direction and a width in a circumferential direction, wherein the shim tray includes:

at least one shim pocket configured to accommodate at least two shim plates; and at least two shim plates each comprising a shim core, the at least two shim plates being arranged one above the other in the radial direction in the at least one shim pocket, wherein surfaces of the at least two shim plates comprise an insulating coating that is a phosphatized surface of the shim core.

15. The gradient coil unit as claimed in claim 14, wherein the shim tray comprises at least two shim pockets, each of the at least two shim pockets being configured to accommodate at least two shim plates.

16. The gradient coil unit as claimed in claim 14, comprising a primary coil unit configured to generate a magnetic field gradient, the gradient coil omitting a secondary coil unit.

17. A magnetic resonance device comprising:

a main magnet;

a high-frequency antenna unit;

a gradient coil unit;

a shim tray receptacle; and a shim tray configured to be pushed into the shim tray receptacle, the shim tray being elongated, having a length in a longitudinal direction, a height in a radial direction and a width in a circumferential direction, the shim tray comprising:

at least two shim pockets each configured to accommodate at least two shim plates; and at least two shim plates each comprising a shim core, the at least two shim plates being arranged one above the other in the radial direction in one of the at least two shim pockets, wherein surfaces of the at least two shim plates have an insulating coating that is a phosphatized surface of the shim core.

18. The magnetic resonance device as claimed in claim 17, wherein the shim tray and the shim tray receptacle are arranged between the main magnet and the gradient coil unit, or between the gradient coil unit and the high-frequency antenna unit.

19. The magnetic resonance device as claimed in claim 17, wherein the shim tray and the shim tray receptacle are integrated into the high-frequency antenna unit.

20. The magnetic resonance device as claimed in claim 17, wherein the gradient coil unit comprises a primary coil unit configured to generate a magnetic field gradient, the gradient coil omitting a secondary coil unit.

* * * * *